US008413320B2

(12) United States Patent
Hafeli et al.

(10) Patent No.: US 8,413,320 B2
(45) Date of Patent: Apr. 9, 2013

(54) METHOD OF GOLD REMOVAL FROM ELECTRONIC COMPONENTS

(75) Inventors: Paul B. Hafeli, Ventura, CA (US); Eli Holzman, Thousand Oaks, CA (US); Aaron J. Stein, Santa Barbara, CA (US); Michael Vargas, Goleta, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 13/016,316

(22) Filed: Jan. 28, 2011

(65) Prior Publication Data

US 2012/0192406 A1   Aug. 2, 2012

(51) Int. Cl.
  *H01R 43/00*   (2006.01)
(52) U.S. Cl.
  USPC ........... 29/825; 29/840; 228/180.22; 228/264
(58) Field of Classification Search ............... 29/408.06, 29/825, 840; 228/264, 180.22
  See application file for complete search history.

(56) References Cited

U.S. PATENT DOCUMENTS

| 3,715,797 | A | * | 2/1973 | Jackson et al. ................ 29/846 |
| 4,078,714 | A | * | 3/1978 | Spirig ........................... 228/264 |
| 4,323,631 | A | * | 4/1982 | Spirig ............................. 228/19 |
| 4,416,408 | A | * | 11/1983 | Spirig ............................. 228/19 |
| 4,426,251 | A | | 1/1984 | Ida et al. |
| 4,491,084 | A | | 1/1985 | Marshall, Jr. |
| 4,499,120 | A | | 2/1985 | Marshall, Jr. |
| 4,668,289 | A | | 5/1987 | Langer et al. |
| 4,832,743 | A | | 5/1989 | Perovetz et al. |
| 4,887,762 | A | | 12/1989 | Baker |
| 4,923,521 | A | * | 5/1990 | Liu et al. ............................ 134/5 |
| 4,934,582 | A | * | 6/1990 | Bertram et al. ................. 228/19 |
| 5,065,931 | A | * | 11/1991 | Liu et al. .......................... 228/19 |
| 5,081,949 | A | | 1/1992 | Berneur et al. |
| 5,130,164 | A | | 7/1992 | Hutchison et al. |
| 5,169,057 | A | | 12/1992 | Blacka et al. |
| 5,271,822 | A | | 12/1993 | Nolan et al. |
| 5,288,009 | A | | 2/1994 | Corlay et al. |
| 5,305,941 | A | * | 4/1994 | Kent et al. ....................... 228/19 |
| 5,458,281 | A | * | 10/1995 | Downing et al. ............. 228/264 |
| 5,770,835 | A | | 6/1998 | Sakuyama et al. |
| 5,901,898 | A | * | 5/1999 | Strempke ........................ 228/19 |
| 5,957,736 | A | | 9/1999 | Moriuchi et al. |
| 6,110,823 | A | | 8/2000 | Eldridge et al. |
| 6,165,912 | A | | 12/2000 | McConnell et al. |
| 6,281,120 | B1 | | 8/2001 | Strnad |
| 6,838,009 | B2 | | 1/2005 | Arvin et al. |
| 2008/0041923 | A1 | | 2/2008 | Kato et al. |

* cited by examiner

*Primary Examiner* — Carl Arbes
(74) *Attorney, Agent, or Firm* — Pierce Atwood LLP; Joseph M. Maraia

(57) ABSTRACT

In some embodiments, a method removes gold plating on an electronic component. The method includes forming a gold and solder mixture on the electronic component via a first incrementally controlled heating procedure; incrementally cooling the electronic component via a first cooling procedure; wicking part or all of the gold and solder mixture from the electronic component to a metallic screen via a second incrementally controlled heating procedure; and incrementally cooling the electronic component via a second cooling procedure.

10 Claims, 14 Drawing Sheets

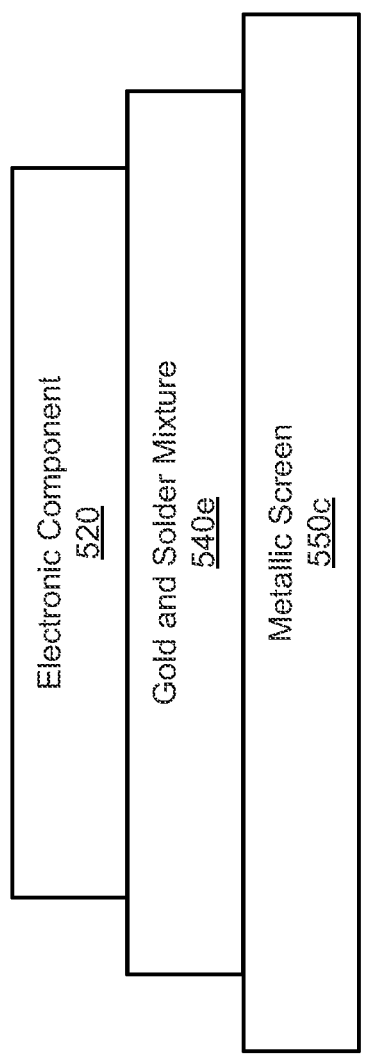

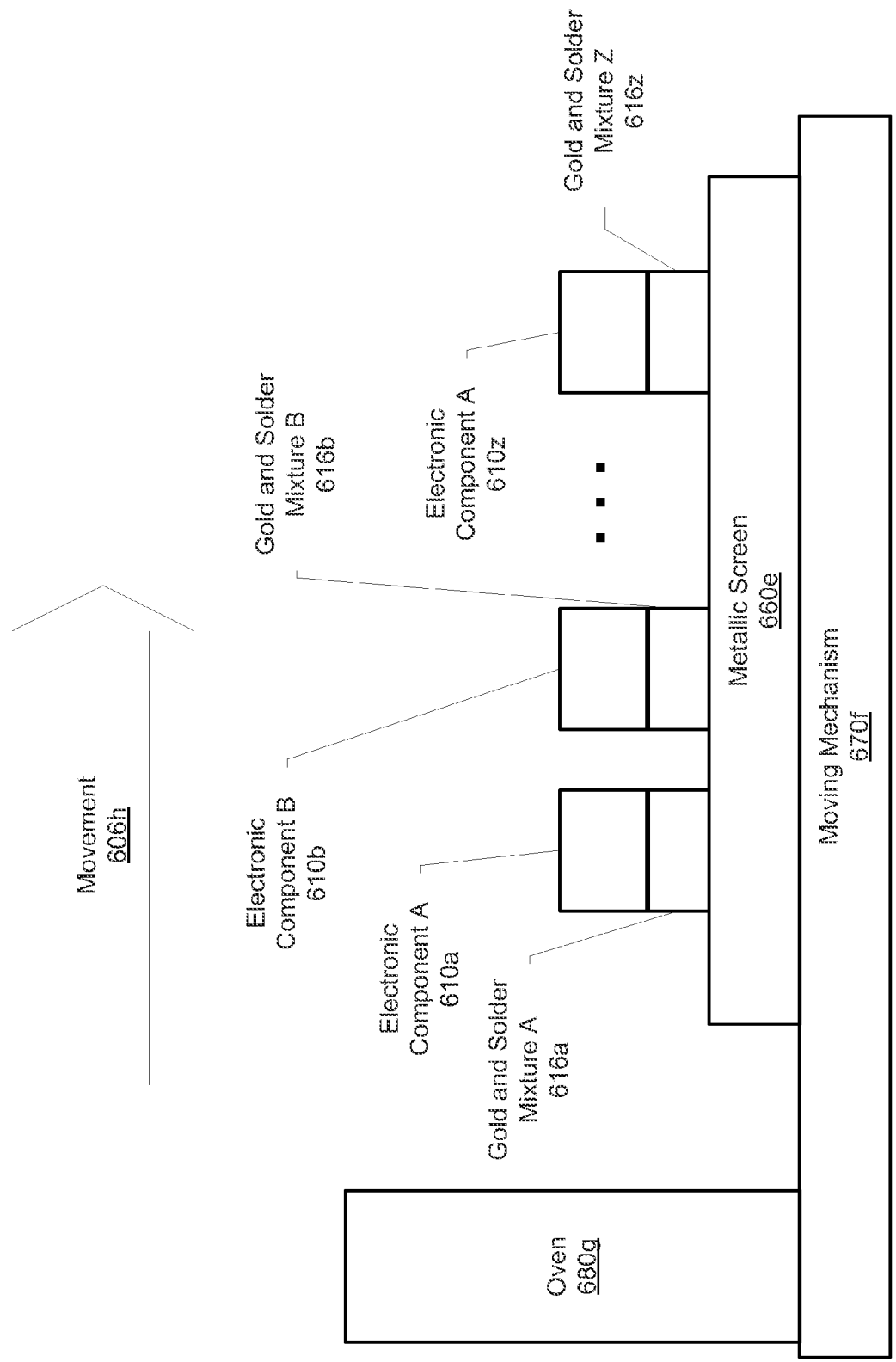

METHOD OF GOLD REMOVAL FROM ELECTRONIC COMPONENTS

BACKGROUND

Connections on electronic components are typically plated in gold due to the restriction of hazardous substances (i.e., lead) in electrical and electronic equipment. However, in some environments, the gold plating becomes brittle and can cause the failure of the connections on the electronic components. The gold plating is typically removed by dipping the connections on the electronic components in solder pots or hand soldering the connections. However, the dipping of the connections on the electronic components in solder pots and the hand soldering of the connections can cause thermal shock and damage the electronic components. Thus, a need exists in the art for gold removal from connections on the electronic components with the features as described herein.

SUMMARY

One approach provides a method for gold removal from electronic components. The method includes (a) forming a gold and solder mixture on the electronic component via a first incrementally controlled heating procedure; (b) incrementally cooling the electronic component via a first cooling procedure; (c) wicking part or all of the gold and solder mixture from the electronic component to a metallic screen via a second incrementally controlled heating procedure; and (d) incrementally cooling the electronic component via a second cooling procedure. In some examples, the step (c) further includes positioning the electronic component on the metallic screen to facilitate transfer of the gold and solder mixture to the metallic screen. In other examples, the step (a) further includes temporarily adhering at least one of solder paste and solder preform to a non-metallic substrate to form a metered solder pad; and positioning the electronic component on the metered solder pad. In other examples, the step (c) further includes depositing flux on the electronic component placed on the metallic screen.

Another approach provides a method for electronic thermal shock management. The method includes (a) automatically unloading a plurality of electronic components from an electronic component holder to individual solder pads adhered to a non-metallic substrate; (b) positioning the non-metallic substrate on a first moving mechanism; (c) moving the non-metallic substrate through a first oven via the first moving mechanism to heat and cool the plurality of electronic components based on a first temperature profile, wherein the heating of each of the solder pads forms a gold and solder mixture on each of the plurality of electronic components; (d) placing the plurality of electronic components on a metallic screen from the non-metallic substrate; (e) loading the metallic screen on a second moving mechanism; and (f) moving the metallic screen through a second oven via the second moving mechanism to heat and cool the plurality of electronic components based on a second temperature profile, wherein the heating of each of the electronic components wicks part or all of the gold and solder mixture to the metallic screen. In some examples, gold in the gold and solder mixture remaining in a solder joint of the electronic component after step (c) is substantially less than 3% gold by volume. In other examples, the method further includes (g) automatically loading the plurality of electronic components into the electronic component holder.

Any of the approaches described herein can include one or more of the following examples.

In some examples, the non-metallic substrate includes a composite material.

In some examples, the metallic screen includes a flux coating to facilitate transfer of the gold and solder mixture to the metallic screen.

In other examples, the first incrementally controlled heating procedure has a temperature range of substantially between 0.1 degrees Celsius per second and 3.0 degrees Celsius per second and the first cooling procedure has a temperature range of substantially between 0.1 degrees Celsius per second and 3.0 degrees Celsius per second.

In some examples, the second incrementally controlled heating procedure has a temperature range of substantially between 0.1 degrees Celsius per second and 3.0 degrees Celsius per second and the second cooling procedure has a temperature range of substantially between 0.1 degrees Celsius per second and 3.0 degrees Celsius per second.

In other examples, the first incrementally controlled heating procedure is substantially the same as the second incrementally controlled heating procedure and the first cooling procedure is substantially the same as the second cooling procedure.

The gold removal from electronic components technology described herein can provide one or more of the following advantages. An advantage to the technology is the gradual heating and/or cooling of the electronic components minimizes thermal stress on the electronic components. Another advantage to the technology is the gradual heating and/or cooling of the electronic components increases the useful lifespan of the electronic components.

Another advantage to the technology is the increased useful lifespan of the electronic components reduces the cost of the devices connected to the electronic components by decreasing the maintenance cost and down-time of the devices. Another advantage to the technology is the repeatable and safe method of diluting the gold from the electronic components thereby decreasing the production cost while increasing the useful environments in which the electronic component can be utilized.

BRIEF DESCRIPTION OF THE DRAWINGS

The foregoing and other objects, features and advantages will be apparent from the following more particular description of the embodiments, as illustrated in the accompanying drawings in which like reference characters refer to the same parts throughout the different views. The drawings are not necessarily to scale, emphasis instead being placed upon illustrating the principles of the embodiments.

FIGS. 5A-5E are block diagrams illustrating an exemplary process for gold removal from an electronic component; and FIGS. 6A-6H are block diagrams illustrating an exemplary process for gold removal from electronic components.

DETAILED DESCRIPTION

The gold removal from electronic components technology described herein enables the gradual heating and/or cooling of the electronic components to minimize damage and prolong the useful life of the electronic components. The technology includes the placement of solder paste and/or printed solder pads on a non-metallic substrate. The gold plated electronic components are automatically or manually placed on the printed solder pads. The printed solder pads are then mass reflowed (heated and/or cooled) to form a solder/gold mix on the printed solder pads. The printed solder pads are then placed on a fluxed metallic screen. The fluxed metallic screen is then mass reflowed (heated and/or cooled) and the solder/gold mix wicks (e.g., capillary force, absorption force, etc.) to the hot fluxed metallic screen, thereby clearing the electronic component of the gold plating and replacing the gold plating with a solder/gold mix. The gold on the electronic components is advantageously diluted and removed to prevent gold embrittlement of the solder joint on the electronic component (e.g., removing the gold to five micrometers on the electronic component, removing the gold to five to ten micrometers on the electronic component, etc.)

Figure 1:
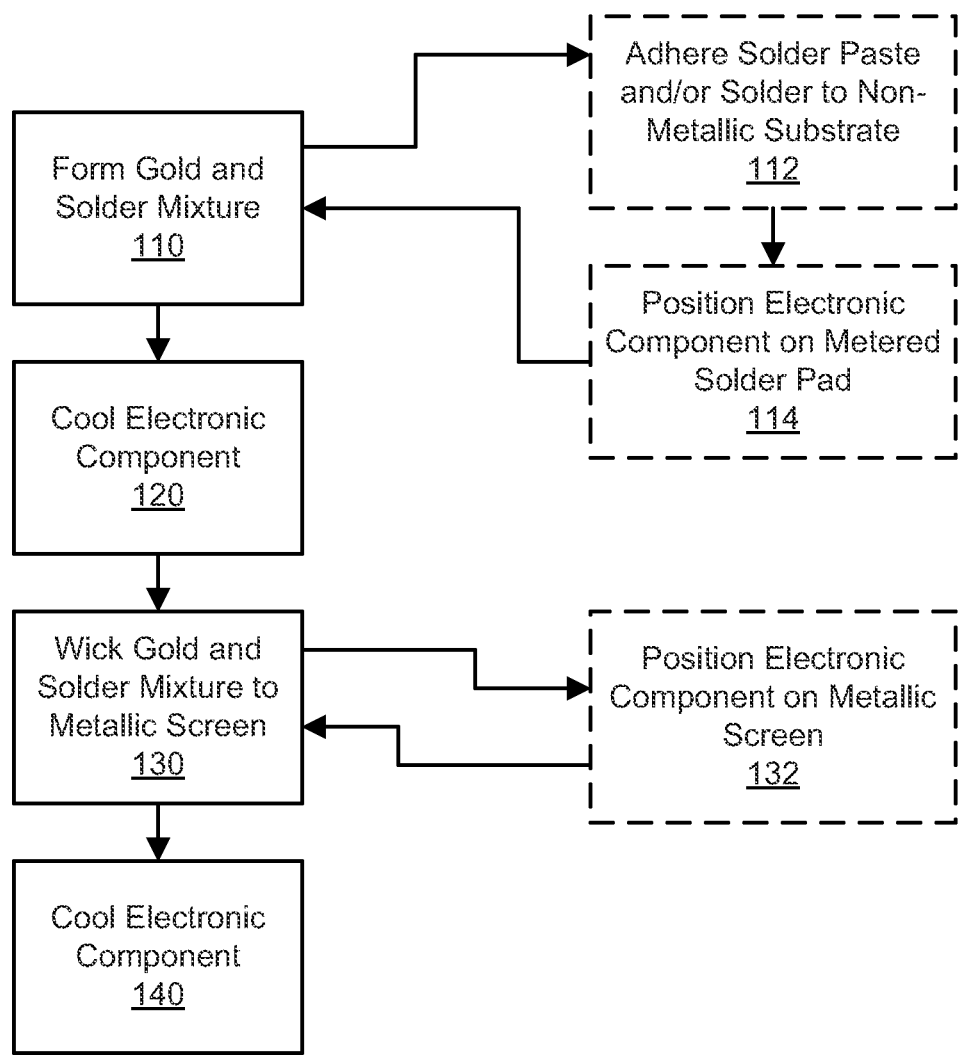
FIG. 1 is a flowchart of an exemplary process for gold removal from electronic components.

FIG. 1 is a flowchart 100 of an exemplary process for gold removal from electronic components. The process includes forming (110) a gold and solder mixture (e.g., 60% gold and 40% solder, 40% gold and 60% solder, etc.) on the electronic component (e.g., surface-mount technology component, integrated circuit component, leadless electronic component, etc.) via a first incrementally controlled heating procedure (e.g., +2.0° Celsius per second heating, +200° Celsius per minute heating, etc.). The first heating procedure advantageously enables the electronic component to be heated in a controlled fashion (i.e., in a temperature controlled environment), thereby minimizing thermal stress on the electronic components and maximizing the useful life of the electronic component. The process further includes incrementally cooling (120) the electronic component via a first cooling procedure (e.g., −1.0° Celsius per second cooling, −100° Celsius per minute cooling, etc.). The first cooling procedure advantageously enables the electronic component to be cooled in a controlled fashion (i.e., in a temperature controlled environment), thereby minimizing thermal stress on the electronic components and maximizing the useful life of the electronic component.

The process further includes wicking (130) part or all of the gold and solder mixture from the electronic component to a metallic screen (e.g., copper, iron, etc.), via a second incrementally controlled heating procedure (e.g., +3.0° Celsius per second heating, +400° Celsius per minute heating, etc.). The second heating procedure advantageously enables the electronic component to be heated in a controlled fashion (i.e., in a temperature controlled environment), thereby minimizing thermal stress on the electronic components and maximizing the useful life of the electronic component. The part or all of the gold and solder mixture is attracted to the metallic screen due to a capillary force between the gold and solder mixture and metallic screen. In other words, the metallic screen is advantageously a carrier to absorb the gold and solder mixture from the electronic component. Although the process is described as utilizing the metallic screen, any other type of material that provides for the capillary force can be utilized in the process.

The process further includes incrementally cooling (140) the electronic component via a second cooling procedure (e.g., −2.0° Celsius per second cooling, −400° Celsius per minute cooling, etc.). The second cooling procedure advantageously enables the electronic component to be cooled in a controlled fashion (i.e., in a temperature controlled environment), thereby minimizing thermal stress on the electronic components and maximizing the useful life of the electronic component. Although the process describes the first heating procedure, the first cooling procedure, the second heating procedure, and the second cooling procedure, the process can include any number and/or type of heating and/or cooling techniques. For example, the process includes a steady state heating of +1.0° Celsius per second throughout the process and a steady state cooling of −2.0° Celsius per second throughout the process. As another example, the process includes a heating of +1.0° Celsius per second with an incremental increase of +2.0° Celsius per hour throughout the process and a steady state cooling of −2.0° Celsius per second with an incremental decrease of −0.5° Celsius per hour cooling throughout the process.

In some examples, the process includes temporarily adhering (112) at least one of solder paste and solder perform to a non-metallic substrate to form a metered solder pad (e.g., stone, synthetic material, etc.). In other examples, the process includes positioning (114) the electronic component on the metered solder pad. The positioning (114) of the electronic component can, for example, be performed by an operator (e.g., directly, indirectly, etc.) and/or an automated positioning mechanism (e.g., robot, factory machine, etc.).

In other examples, the process includes positioning (132) the electronic component on the metallic screen to facilitate transfer of the gold and solder mixture to the metallic screen. The metallic screen can be, for example, a solder absorbing screen, a solder wicking screen, and/or any other type of metallic screen. In some examples, the process includes positioning the electronic component on a first metallic screen to facilitate absorption of the gold and solder mixture to the first metallic screen and positioning the electronic component on a second metallic screen to facilitate wicking of the gold and solder mixture to the second metallic screen.

In some examples, the non-metallic substrate comprises a composite material (e.g., woven carbon fiber, metal matrix material, etc.). In other examples, the metallic screen includes a flux coating to facilitate transfer of the gold and solder mixture to the metallic screen. The flux coating can, for example, remove surface oxidation on the electronic component and/or facilitate the removal of the gold. In some examples, the process is performed in a nitrogen environment (e.g., nitrogen filled container, nitrogen stream blown on the electronic component, etc.).

In some examples, the first incrementally controlled heating procedure has a temperature range of substantially between 0.1 degrees Celsius per second and 3.0 degrees Celsius per second and the first cooling procedure has a temperature range of substantially between 0.1 degrees Celsius per second and 3.0 degrees Celsius per second. Although this example illustrates temperature ranges for the heating procedure and the cooling procedure, the technology described herein can utilize any controlled heating/cooling procedures (e.g., 0.001 degrees Celsius per second, ±10.0 degrees Celsius, etc.). Table 1 illustrates an exemplary heating procedure and cooling procedure.

TABLE 1

Exemplary Heating and Cooling Procedures

| Time | Start Temperature | End Temperature | Increase/Decrease |
| --- | --- | --- | --- |
| 0 seconds through 50 seconds | 18° Celsius | 118° Celsius | +2.0° Celsius per second (Heating) |
| 50 seconds through 87 seconds | 118° Celsius | 230° Celsius | +3.0° Celsius per second (Heating) |

TABLE 1-continued

Exemplary Heating and Cooling Procedures

| Time | Start Temperature | End Temperature | Increase/Decrease |
|---|---|---|---|
| 88 seconds through 143 seconds | 230° Celsius | 175° Celsius | −1.0° Celsius per second (Cooling) |
| 144 seconds through 222.5 seconds | 175° Celsius | 18° Celsius | −2.0° Celsius per second (Cooling) |

In other examples, the second incrementally controlled heating procedure has a temperature range of substantially between 0.1 degrees Celsius per second and 3.0 degrees Celsius per second and the second cooling procedure has a temperature range of substantially between 0.1 degrees Celsius per second and 3.0 degrees Celsius per second. Although this example illustrates temperature ranges for the heating procedure and the cooling procedure, the technology described herein can utilize any controlled heating/cooling procedures (e.g., 4.0 degrees Celsius per second, 10.0 degrees Celsius per second, 0.00001 degrees Celsius per second, ±50.0 degrees Celsius, etc.). Table 2 illustrates another exemplary heating procedure and cooling procedure.

TABLE 2

Exemplary Heating and Cooling Procedures

| Time | Start Temperature | End Temperature | Increase/Decrease |
|---|---|---|---|
| 0 seconds through 115 seconds | 15° Celsius | 125° Celsius | +1.0° Celsius per second (Heating) |
| 116 seconds through 139 seconds | 125° Celsius | 160° Celsius | +1.5° Celsius per second (Heating) |
| 140 seconds through 212.5 seconds | 160° Celsius | 15° Celsius | −2.0° Celsius per second (Cooling) |

In some examples, the first incrementally controlled heating procedure is substantially the same as the second incrementally controlled heating procedure and the first cooling procedure is substantially the same as the second cooling procedure. In other examples, gold in the gold and solder mixture remaining in a solder joint of the electronic component after the wicking of part or all of the gold and solder mixture from the electronic component to the metallic screen is substantially less than 3% gold by volume (e.g., ±1.0%, ±0.001%, etc.). The reduction of the gold and solder mixture to substantially less than 3% gold by volume advantageously dilutes and removes the gold to a level that substantially prevents gold embrittlement of the solder joint on the electronic component.

Figure 2:
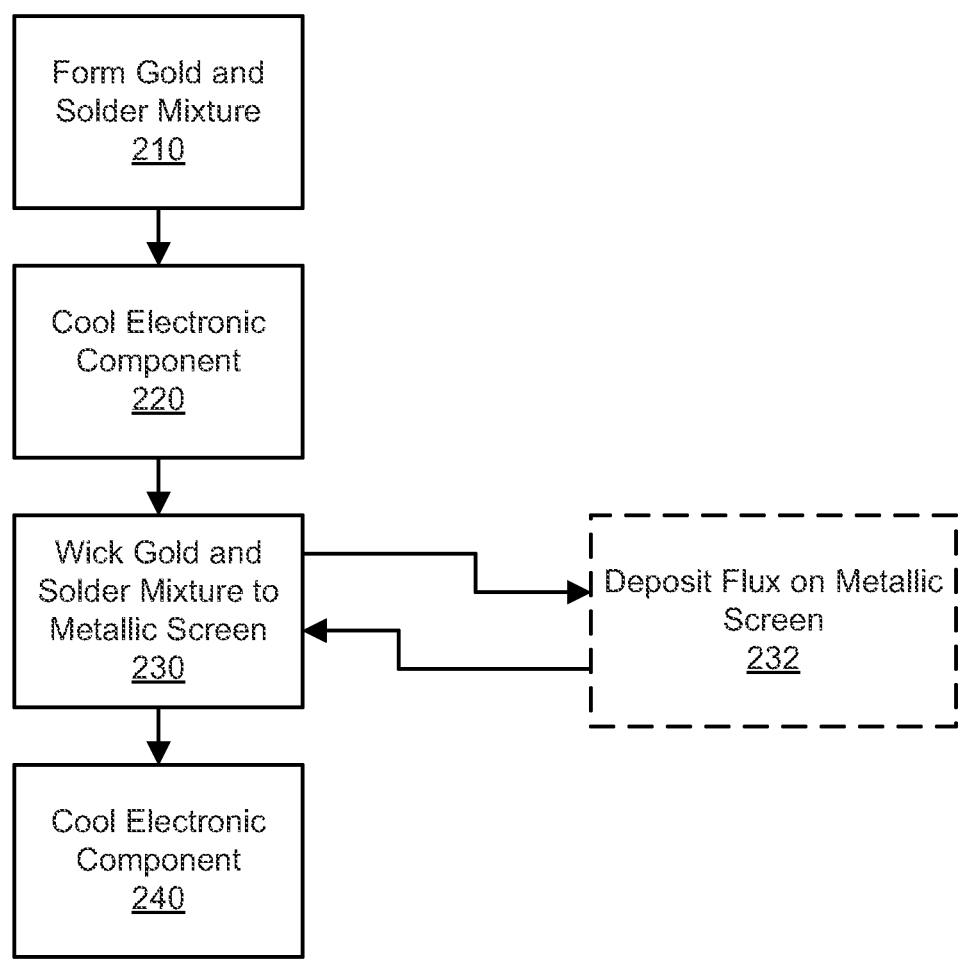
FIG. 2 is a flowchart of another exemplary process for gold removal from electronic components.

FIG. 2 is a flowchart 200 of another exemplary process for gold removal from electronic components. The process includes forming (210) a gold and solder mixture on the electronic component via a first incrementally controlled heating procedure. The process further includes incrementally cooling (220) the electronic component via a first cooling procedure. The process further includes wicking (230) part or all of the gold and solder mixture from the electronic component to a metallic screen via a second incrementally controlled heating procedure. The process further includes incrementally cooling (240) the electronic component via a second cooling procedure. In some examples, the process further includes depositing (232) flux on the electronic component placed on the metallic screen. The heating and cooling procedures described in this exemplary process can utilize any of the examples and/or techniques as described herein. In some examples, the high temperature of the heating procedure described in this exemplary process is the melting temperature of the solder.

Figure 3:
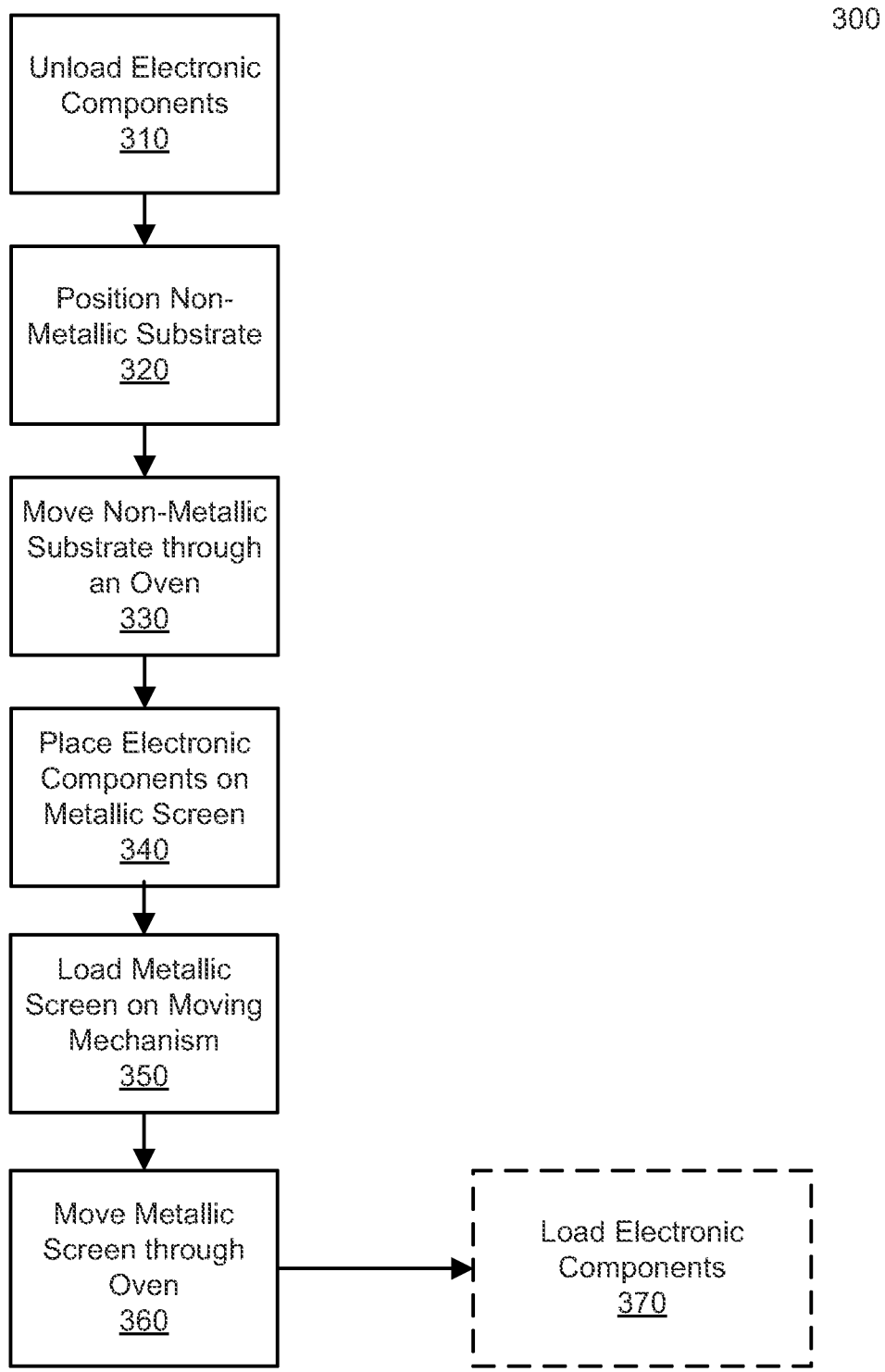
FIG. 3 is a flowchart of an exemplary process for electronic thermal shock management.

FIG. 3 is a flowchart 300 of an exemplary process for electronic thermal shock management. The process includes automatically unloading (310) a plurality of electronic components from an electronic component holder (e.g., tape of components, package of components, stick of components, etc.) to individual solder pads adhered to a non-metallic substrate. The process further includes positioning (320) the non-metallic substrate on a first moving mechanism. The process further includes moving (330) the non-metallic substrate through a first oven (e.g., reflow oven, multi-zone reflow oven, hot plate device, hot air device, etc.) via the first moving mechanism to heat and cool the plurality of electronic components based on a first temperature profile. The heating of each of the solder pads forms a gold and solder mixture on each of the plurality of electronic components.

The process further includes placing (340) the plurality of electronic components on a metallic screen from the non-metallic substrate. The process further includes loading (350) the metallic screen on a second moving mechanism. The process further includes moving (360) the metallic screen through a second oven via the second moving mechanism to heat and cool the plurality of electronic components based on a second temperature profile. The heating of each of the electronic components wicks part or all of the gold and solder mixture to the metallic screen. In some examples, the process further includes automatically loading (370) the plurality of electronic components into the electronic component holder. The heating and cooling profiles described in this exemplary process can utilize any of the examples and/or techniques as described herein. In other examples, the high temperature of the heating profiles described in this exemplary process is the melting temperature of the solder pads. Table 3 illustrates exemplary oven zones associated with another exemplary heating procedure and cooling profiles.

TABLE 3

Exemplary Heating and Cooling Profiles

| Oven Zone | Time | Start Temperature | End Temperature | Increase/Decrease |
|---|---|---|---|---|
| 1 | 0 seconds through 57 seconds | 18° Celsius | 75° Celsius | +1.0° Celsius per second (Heating) |
| 2 | 58 seconds through 158 seconds | 75° Celsius | 225° Celsius | +1.5° Celsius per second (Heating) |
| 5 | 159 seconds through 262.5 seconds | 225° Celsius | 18° Celsius | −2.0° Celsius per second (Cooling) |
| 6 | 263 seconds through 470 seconds | 18° Celsius | 225° Celsius | +1.0° Celsius per second (Heating) |
| 10 | 471 seconds through 533.5 seconds | 225° Celsius | 100° Celsius | −2.0° Celsius per second (Cooling) |
| 11 | 534 seconds through 616 seconds | 100° Celsius | 18° Celsius | −1.0° Celsius per second (Cooling) |

Figure 4:
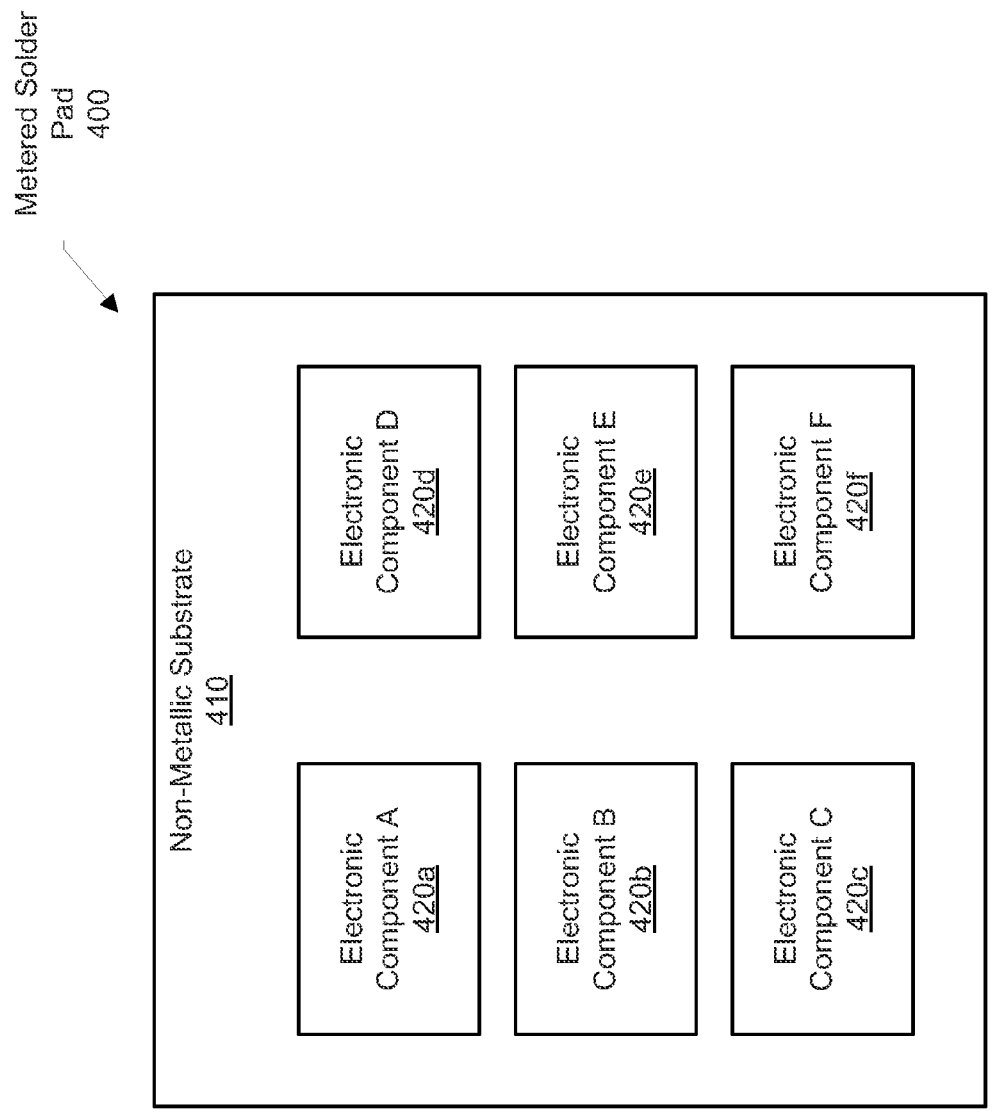
FIG. 4 is a block diagram of an exemplary metered solder pad.

FIG. 4 is a block diagram of an exemplary metered solder pad 400. The metered solder pad 400 includes a non-metallic substrate 410 and a plurality of electronic components A 420a, B 420b, C 420c, D 420d, E 420e, and F 420f.

Figure 5A:
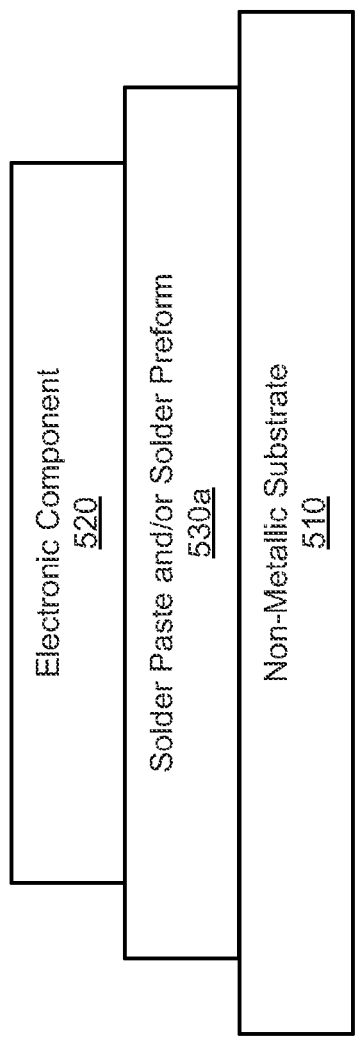
Figure 5B:
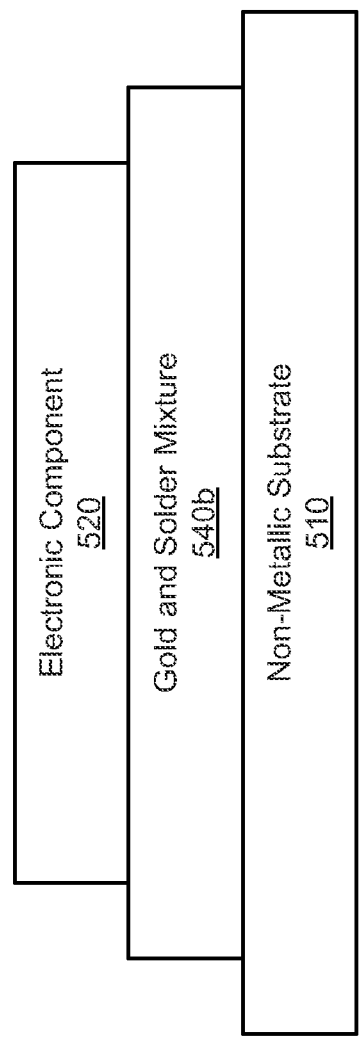
Figure 5C:
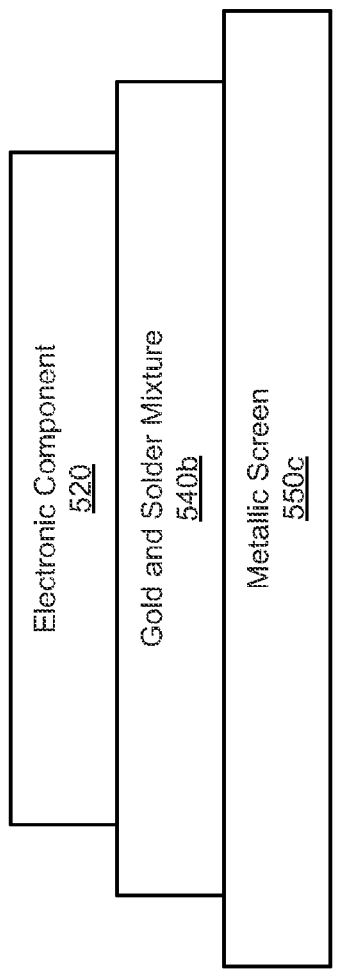
Figure 5D:
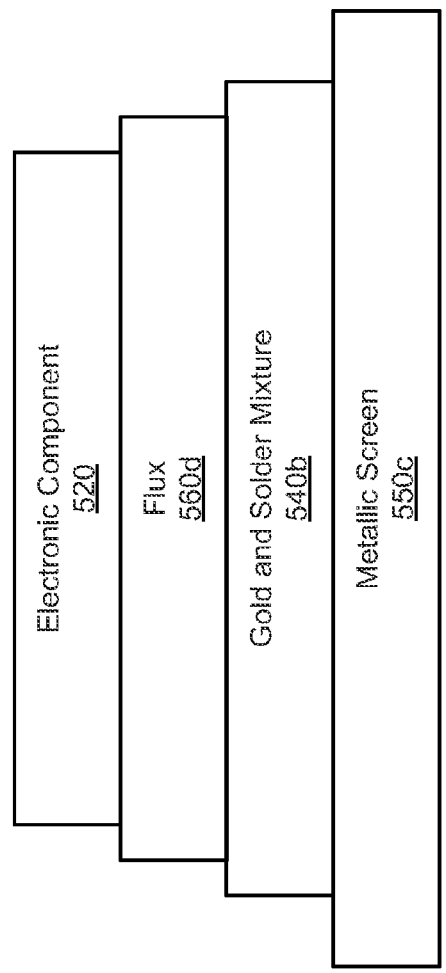

FIGS. 5A-5E are block diagrams illustrating an exemplary process for gold removal from an electronic component. FIG. 5A illustrates an exemplary solder paste and/or solder preform 530a temporarily adhered to a non-metallic substrate 510 (also referred to as forming a metered solder pad). An electronic component 520 is positioned on the solder paste and/or solder preform 530a. FIG. 5B illustrates a gold and solder mixture 540b formed on the non-metallic substrate 510 via a first incrementally controlled heating procedure. FIG. 5C illustrates the electronic component 520 and the gold and solder mixture 540b placed on a metallic screen 550c. FIG. 5D illustrates flux 560d deposited on the metallic screen 550c. FIG. 5E illustrates part or all of the gold and solder mixture 540e from the electronic component wicked to the metallic screen 550c via a second incrementally controlled heating procedure.

Figure 6A:
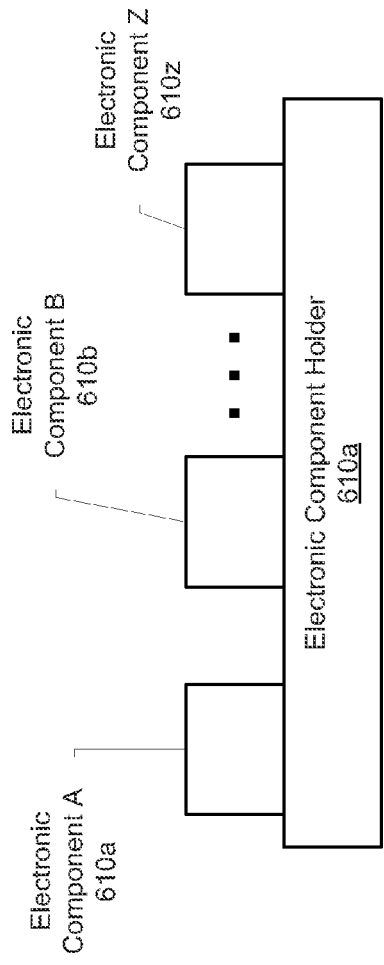
Figure 6B:
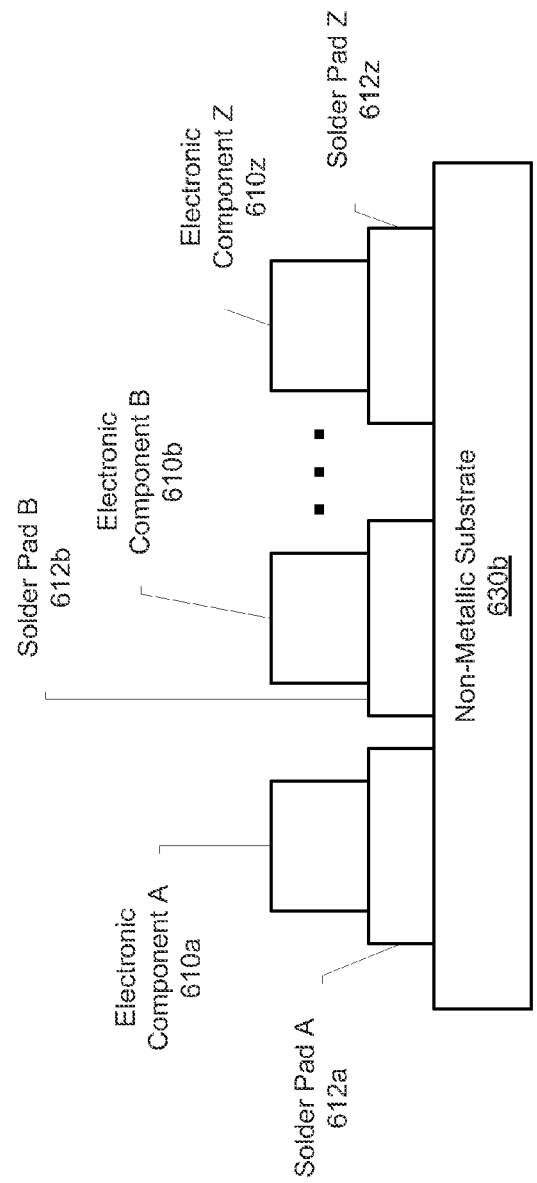
Figure 6C:
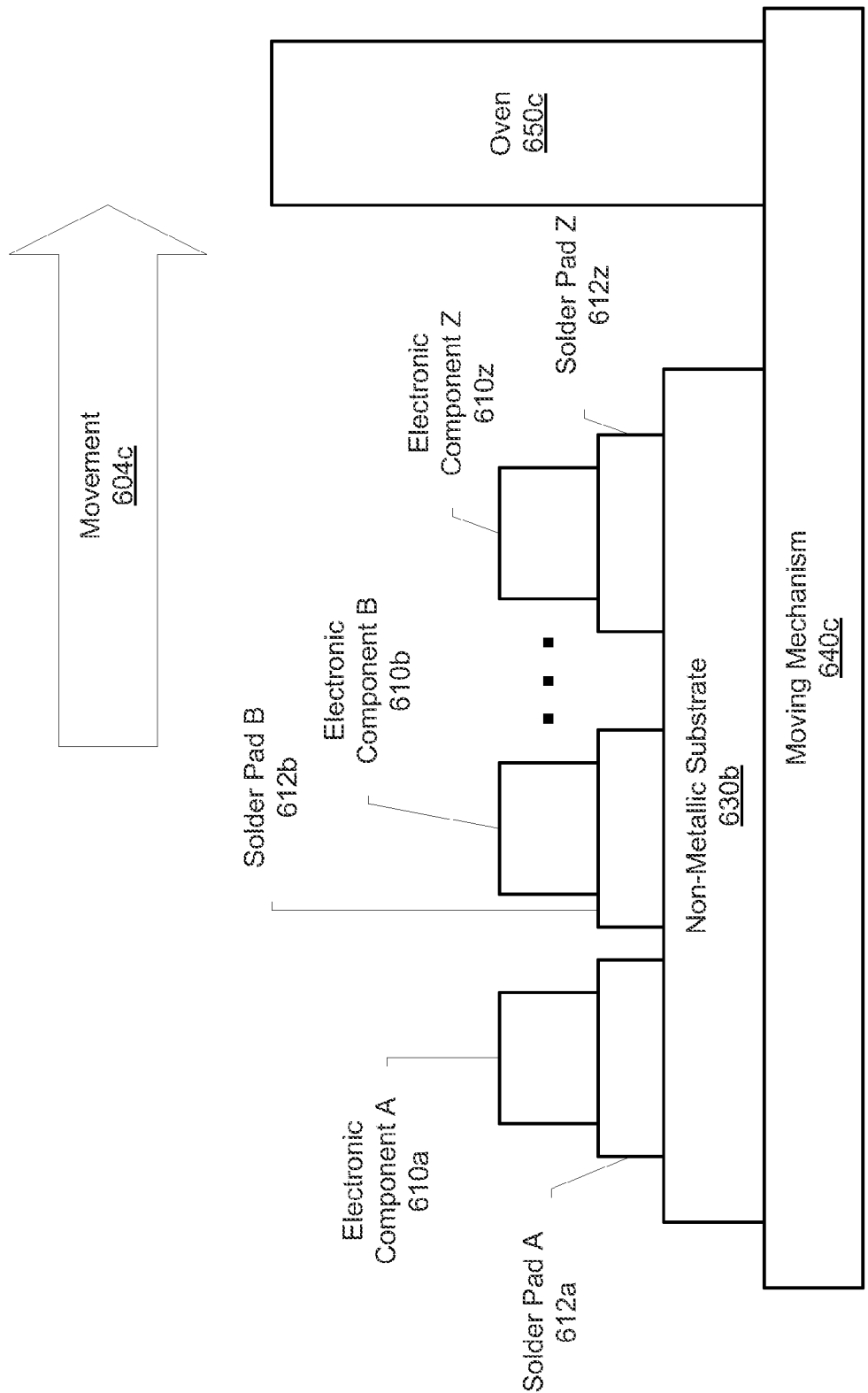
Figure 6D:
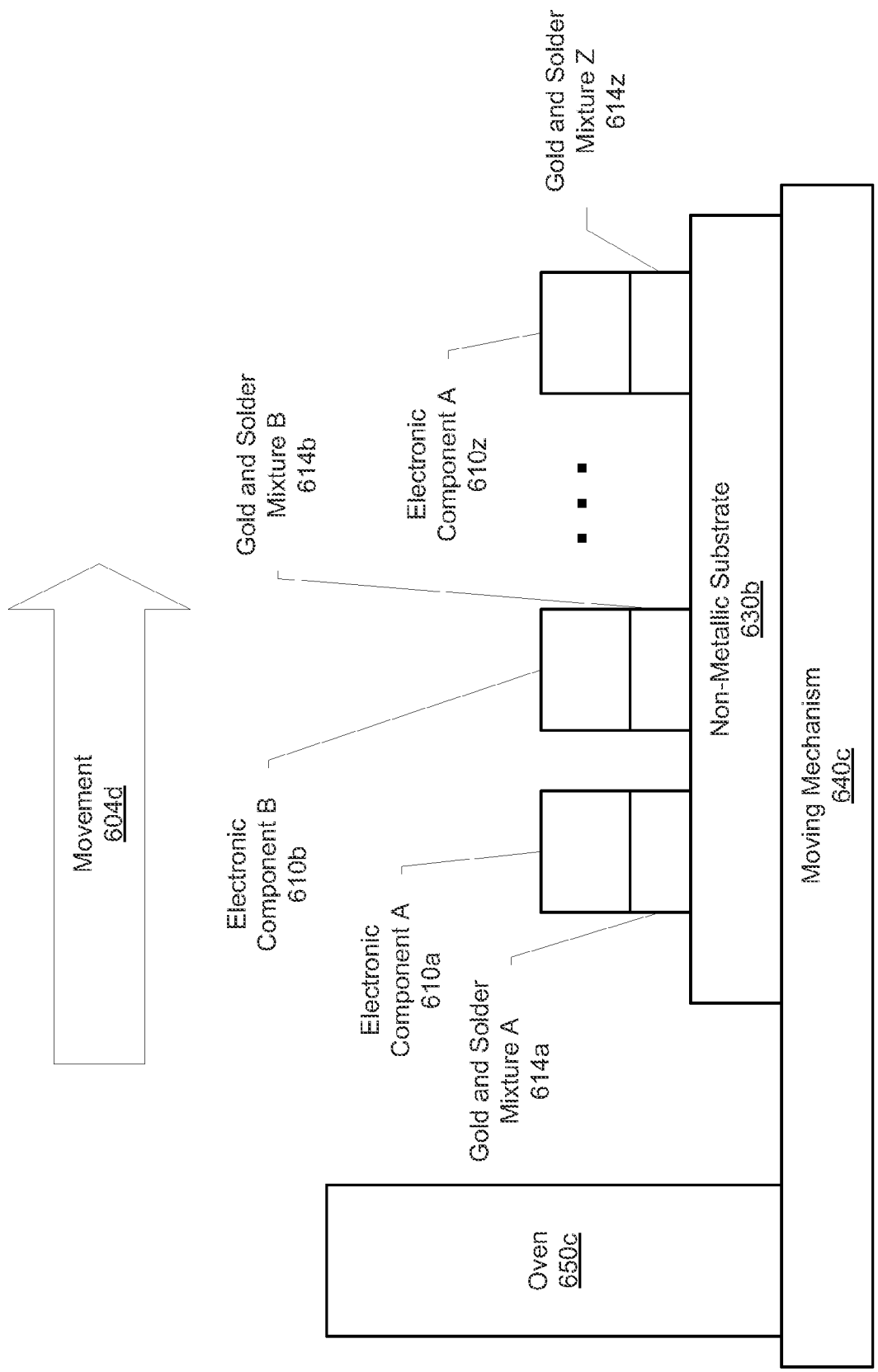

FIGS. 6A-6H are block diagrams illustrating an exemplary process for gold removal from electronic components. FIG. 6A illustrates an electronic component holder 610a holding a plurality of electronic components A 610a, B 610b through Z 610z (generally referred to as electronic components 610). FIG. 6B illustrates the electronic components 610 placed on individual solder pads A 612a, B 612b through Z 612z, respectively (generally referred to as solder pads 612), on a non-metallic substrate 630b. FIG. 6C illustrates the non-metallic substrate 630b positioned on a moving mechanism 640c and movement (604c) of the non-metallic substrate 630b through an oven 650c. FIG. 6D illustrates the non-metallic substrate 630b after movement (604d) through the oven 650c. As illustrated in FIG. 6D, the heating of the solder pads 612 forms a gold and solder mixture A 614a, B 614b through Z 614z (generally referred to as gold and solder mixture 614) on the non-metallic substrate 630b, respectively.

Figure 6E:
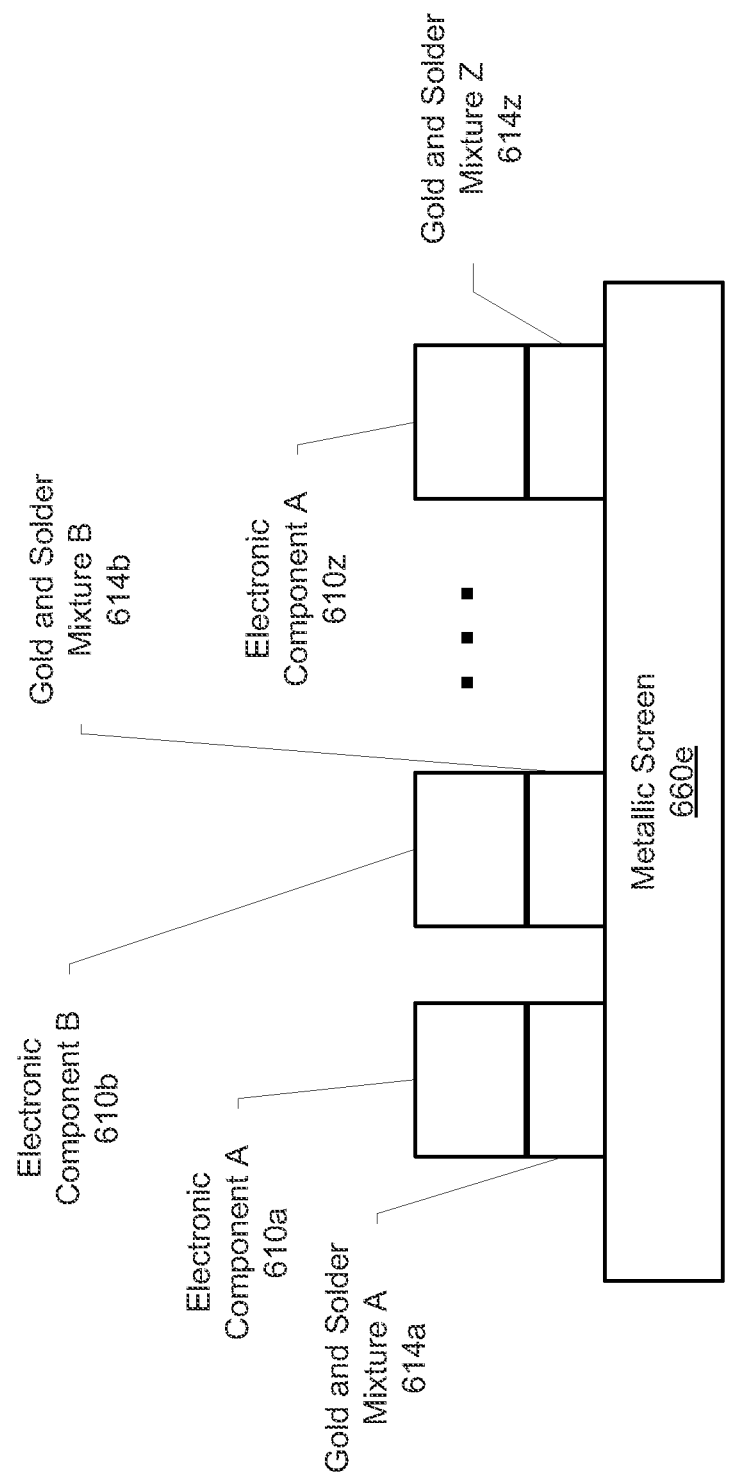
Figure 6F:
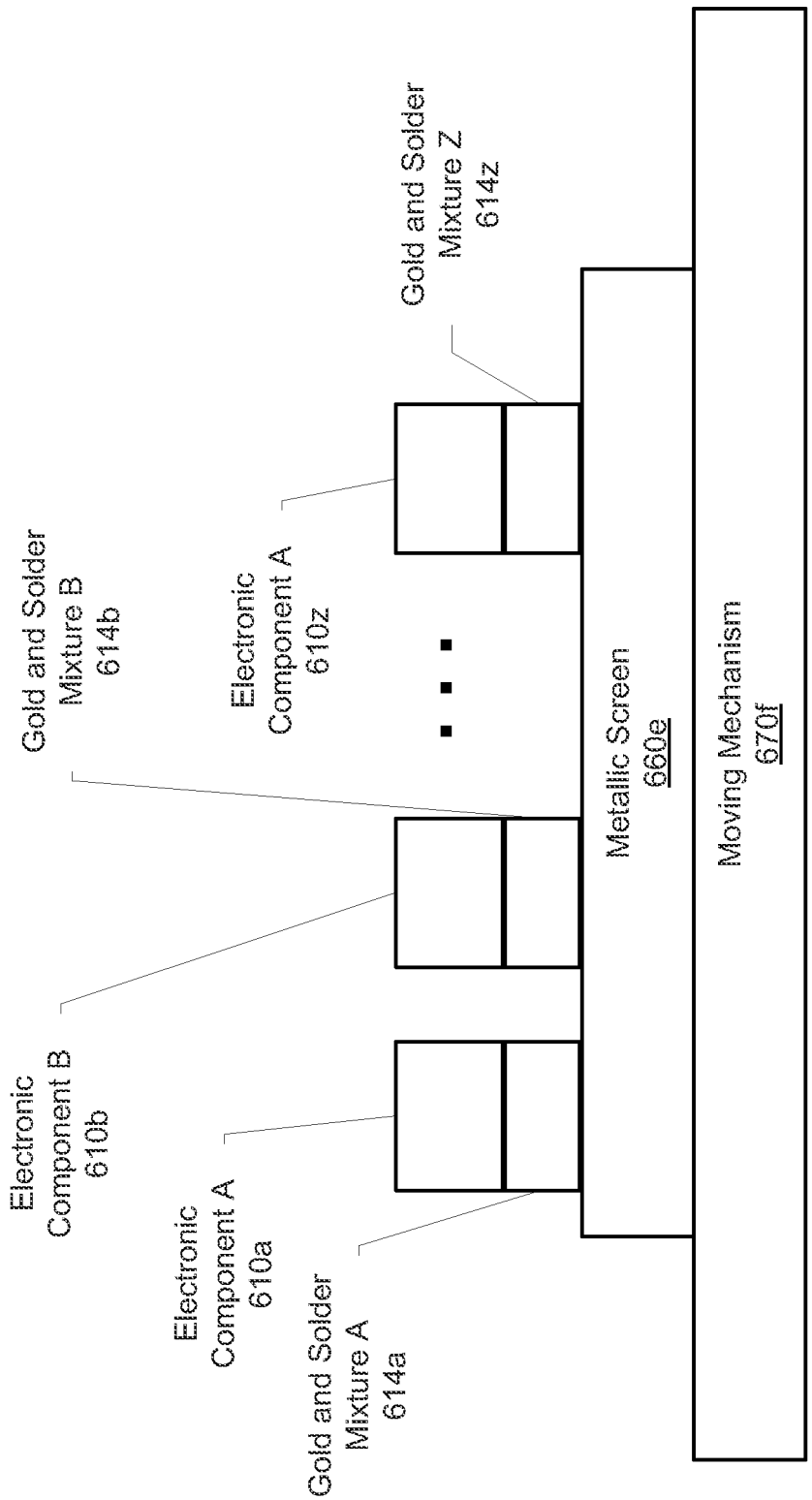
Figure 6G:
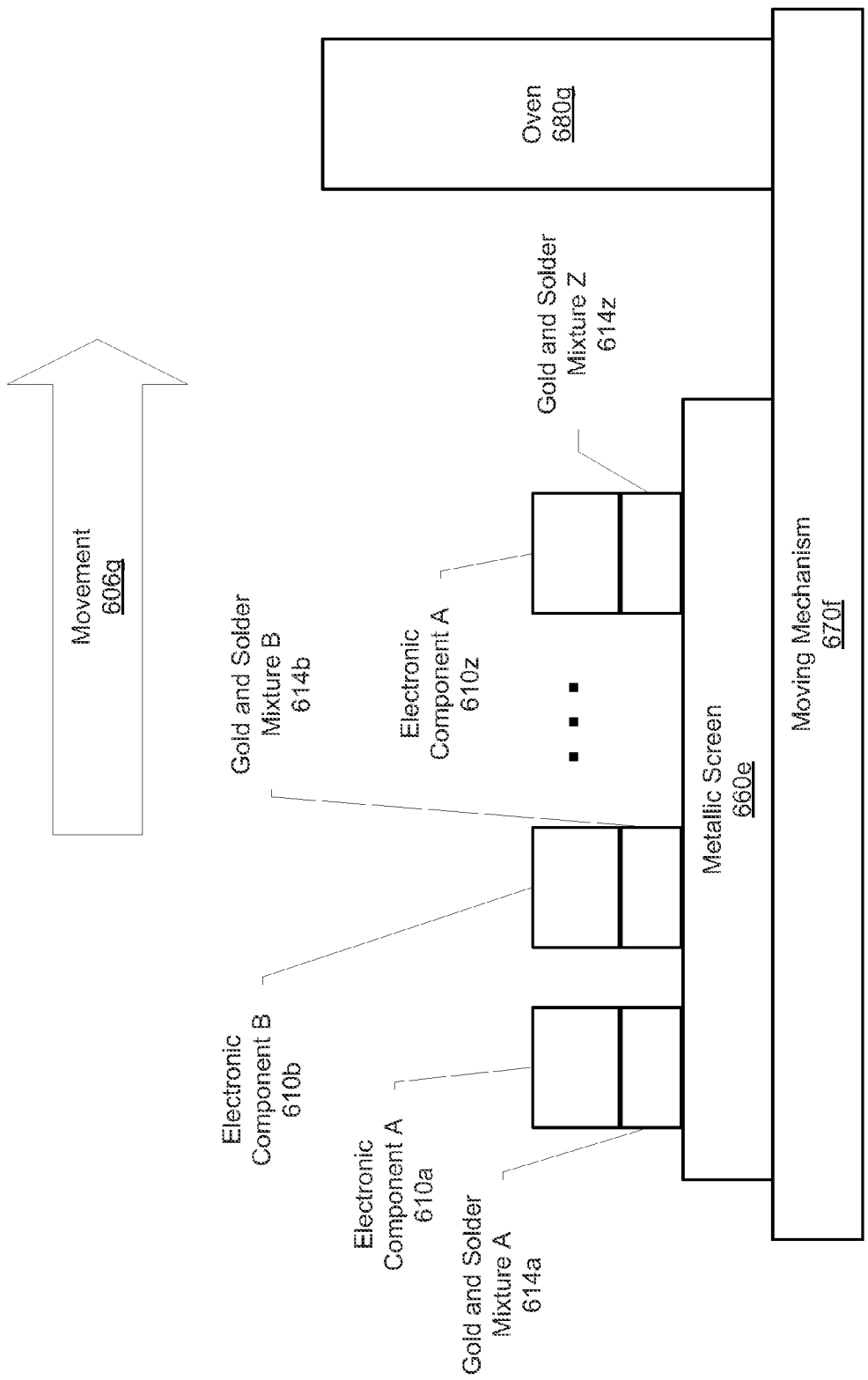

FIG. 6E illustrates the electronic components 610 and the gold and solder mixture 614 placed on a metallic screen 660e. FIG. 6F illustrates the metallic screen 660e loaded on a moving mechanism 670f FIG. 6G illustrates movement (606g) of the metallic screen 660e through an oven 680g. FIG. 6H illustrates the metallic screen 660e after movement (606h) through the oven 680g. As illustrated in FIG. 6H, the heating of the electronic components 610 and the gold and solder mixture 614 wicks the gold and solder mixture A 616a, B 616b through Z 616z to the metallic screen 660e.

Comprise, include, and/or plural forms of each are open ended and include the listed parts and can include additional parts that are not listed. And/or is open ended and includes one or more of the listed parts and combinations of the listed parts.

One skilled in the art will realize the invention may be embodied in other specific forms without departing from the spirit or essential characteristics thereof. The foregoing embodiments are therefore to be considered in all respects illustrative rather than limiting of the invention described herein. Scope of the invention is thus indicated by the appended claims, rather than by the foregoing description, and all changes that come within the meaning and range of equivalency of the claims are therefore intended to be embraced therein.

What is claimed is:

1. A method for removing gold plating on an electronic component, the method comprising:
   (a) forming a gold and solder mixture on the electronic component via a first incrementally controlled heating procedure;
   (b) incrementally cooling the electronic component via a first cooling procedure;
   (c) wicking part or all of the gold and solder mixture from the electronic component to a metallic screen via a second incrementally controlled heating procedure; and
   (d) incrementally cooling the electronic component via a second cooling procedure.

2. The method of claim 1, wherein the step (c) further comprising:
   positioning the electronic component on the metallic screen to facilitate transfer of the gold and solder mixture to the metallic screen.

3. The method of claim 1, wherein the step (a) further comprising:
   temporarily adhering at least one of solder paste and solder preform to a non-metallic substrate to form a metered solder pad; and
   positioning the electronic component on the metered solder pad.

4. The method of claim 3, wherein the non-metallic substrate comprises a composite material.

5. The method of claim 1, wherein the step (c) further comprising:
   depositing flux on the electronic component placed on the metallic screen.

6. The method of claim 1, wherein the metallic screen includes a flux coating to facilitate transfer of the gold and solder mixture to the metallic screen.

7. The method of claim 1, wherein the first incrementally controlled heating procedure has a temperature range of substantially between 0.1 degrees Celsius per second and 3.0 degrees Celsius per second and the first cooling procedure has a temperature range of substantially between 0.1 degrees Celsius per second and 3.0 degrees Celsius per second.

8. The method of claim 1, wherein the second incrementally controlled heating procedure has a temperature range of substantially between 0.1 degrees Celsius per second and 3.0 degrees Celsius per second and the second cooling procedure has a temperature range of substantially between 0.1 degrees Celsius per second and 3.0 degrees Celsius per second.

9. The method of claim 1, wherein the first incrementally controlled heating procedure is substantially the same as the second incrementally controlled heating procedure and the first cooling procedure is substantially the same as the second cooling procedure.

10. The method of claim 1, wherein gold in the gold and solder mixture remaining in a solder joint of the electronic component after step (c) is substantially less than 3% gold by volume.

\* \* \* \* \*